(12) United States Patent
Yeo

(10) Patent No.: US 7,170,170 B2
(45) Date of Patent: Jan. 30, 2007

(54) BUMP FOR SEMICONDUCTOR PACKAGE, SEMICONDUCTOR PACKAGE APPLYING THE BUMP, AND METHOD FOR FABRICATING THE SEMICONDUCTOR PACKAGE

(75) Inventor: Yong-Woon Yeo, Daejeon (KR)

(73) Assignee: Nepes Co., Ltd., Chungcheongbuk-Do (KR)

( * ) Notice: Subject to any disclaimer, the term of this patent is extended or adjusted under 35 U.S.C. 154(b) by 59 days.

(21) Appl. No.: 10/976,427

(22) Filed: Oct. 29, 2004

(65) Prior Publication Data

US 2005/0224991 A1    Oct. 13, 2005

(30) Foreign Application Priority Data

Apr. 8, 2004   (KR) ...................... 10-2004-0024217

(51) Int. Cl.
   *H01L 29/12* (2006.01)
(52) U.S. Cl. ...................... 257/737; 257/738; 257/778; 438/613; 438/108
(58) Field of Classification Search ................ 438/108, 438/613; 257/737, 738, 778
   See application file for complete search history.

(56) References Cited

U.S. PATENT DOCUMENTS

| | | | | |
|---|---|---|---|---|
| 5,508,561 | A | * | 4/1996 | Tago et al. ................. 257/737 |
| 6,612,024 | B1 | * | 9/2003 | Sasaki et al. ................. 29/840 |
| 6,940,178 | B2 | * | 9/2005 | Kweon et al. .............. 257/780 |
| 2002/0149118 | A1 | | 10/2002 | Yamaguchi et al. |

* cited by examiner

*Primary Examiner*—Roy Karl Potter
(74) *Attorney, Agent, or Firm*—Marger Johnson & McCollom, P.C.

(57) ABSTRACT

The present invention discloses a bump for a semiconductor package, a semiconductor package applying the bump, and a method for fabricating the semiconductor package. As a second bump unit contacting an electrode terminal of a PCB has a smaller width than a first bump unit contacting an electrode pad of a semiconductor chip through a metal adhering layer, even if a pitch between the electrode pads of the semiconductor chip does not correspond to the pitch between the electrode terminals of the PCB, contact reliability is improved by the bump. In addition, the bump does not contact lines adjacent to the electrode terminal of the PCB, thereby preventing a mis-operation of the semiconductor package. Accordingly, the pitch between the electrode pads of the semiconductor chip and the pitch between the bumps can be minimized.

24 Claims, 6 Drawing Sheets

BUMP FOR SEMICONDUCTOR PACKAGE, SEMICONDUCTOR PACKAGE APPLYING THE BUMP, AND METHOD FOR FABRICATING THE SEMICONDUCTOR PACKAGE

CROSS REFERENCE TO RELATED APPLICATIONS

This U.S. non-provisional application claims priority under 35 U.S.C. § 119 to Korean Patent Application No. 2004-24217 filed Apr. 8, 2004, the contents of which are incorporated by reference.

BACKGROUND OF THE INVENTION

1. Field of the Invention

The present invention relates to a bump for a semiconductor package, a semiconductor package applying the bump, and a method for fabricating the semiconductor package.

2. Description of the Background Art

In general, a semiconductor package fabricated by wire boding is larger in size than a semiconductor chip because electrode terminals of a printed circuit board (PCB) and electrode pads of the semiconductor chip are electrically connected by a conductive wire. In addition, wire bonding requires a long time, which is disadvantageous in a slim and lightweight shape and a mass production.

According to high integration, high performance and high speed tendencies of the semiconductor chip, there have been various attempts for a slim and lightweight shape and mass production of the semiconductor package. For example, there has been suggested a semiconductor package in which electrode pads of a semiconductor chip are electrically to electrode terminals of a PCB through solder or metal bumps formed on the electrode pads of the semiconductor chip.

Normally, a flip chip ball grid array method is applied to the semiconductor package using the solder bumps, and a chip-on-glass method is applied to the semiconductor package using the metal bumps.

The flip chip ball grid array method fabricates a semiconductor package by electrically connecting solder bumps contacting electrode pads of a semiconductor chip to pads of a substrate, underfilling the solder bumps to be protected from external environment or mechanical problems, and adhering solder balls to the rear surface of the substrate which the semiconductor chip contacts to be electrically connected to electrode terminals of a PCB.

The chip-on-glass method fabricates a semiconductor package by electrically connecting electrode pads of a semiconductor chip to electrode terminals of a PCB through metal bumps contacting the electrode pads of the semiconductor chip, by thermocompression bonding and hardening the metal bumps to the electrode terminals of the PCB by the medium of a polymer containing anisotropic conductive particles.

FIG. 1 is an exemplary diagram illustrating the semiconductor package using the metal bump. Referring to FIG. 1, the semiconductor package includes a semiconductor chip 20 on which an electrode pad 10 has been formed, a protecting film 30 formed on the surface of the semiconductor chip 20, for selectively exposing the electrode pad 10, a metal adhering layer 40 formed on the electrode pad 10, and extended from the upper portion of the electrode pad 10 to the upper portion of the protecting film 30 around the electrode pad 10, a metal bump 50 formed on the metal adhering layer 40, and a PCB 70 on which an electrode terminal 60 contacting the top surface of the metal bump 50 has been formed.

As described above, in the semiconductor package fabricated according to the chip-on-glass method, the metal bump 50 is formed to contact the electrode pad 10 of the semiconductor chip 20, and thermocompression bonded and hardened to the electrode terminal 60 of the PCB 70 by the medium of a polymer (not shown) containing anisotropic conductive particles, thereby electrically connecting the electrode pad 10 of the semiconductor chip 20 to the electrode terminal 60 of the PCB 70. As compared with the general semiconductor package fabricated by wire bonding, a transmission distance of electric signals is reduced to obtain a high speed, and a size of the semiconductor package is reduced, which is advantageous in a slim and lightweight shape.

On the other hand, a semiconductor process can be applied to the semiconductor chip 20. It is thus possible to minimize a pitch between the electrode pads 10 and a pitch between the bumps 50. Conversely, the semiconductor process cannot be applied to the PCB 70. It is this difficult to reduce a size of lines and electrode terminals 60.

When the pitch between the electrode pads 10 of the semiconductor chip 20 and the pitch between the bumps 50 are minimized, the pitch between the bumps 50 does not correspond to the pitch between the electrode terminals 60 of the PCB 70, to cause contact failure. Accordingly, the bump 50 contacts the patterned lines adjacent to the electrode terminals 60 of the PCB 70.

Still referring to FIG. 1, the metal adhering layer 40 is formed on the electrode pad 10 of the semiconductor chip 20 selectively exposed by the protecting film 30, and the metal bump 50 is formed by plating. In this case, in order to prevent the electrode pad 10 of the semiconductor chip 20 from being damaged in an etching process of the metal adhering layer 40, the metal adhering layer 40 is extended from the upper portion of the electrode pad 10 to the upper portion of the protecting film 30 around the electrode pad 10. The metal bump 50 is formed on the metal adhering layer 40. The center of the top surface of the metal bump 50 is more caved than the edges thereof.

In the case that the metal bump 50 is thermocompression bonded and hardened to the electrode terminal 60 of the PCB 70 by the medium of the polymer containing anisotropic conductive particles, an electric contact resistance between the metal bump 50 and the electrode terminal 60 of the PCB 70 is increased, and an adhesion property thereof is deteriorated.

FIG. 2 is an exemplary diagram illustrating the bump 50 and the electrode terminal 60 of the PCB 70 coupled through a solder cap formed on the top surface of the bump 50 in FIG. 1.

As illustrated in FIG. 2, the metal bump 50 contacts the electrode terminal 60 of the PCB 70 through the solder cap 80 formed on its top surface.

The solder cap 80 formed on the top surface of the bump 50 generates alpha particles by radiation during the process for fabricating the semiconductor package, thereby causing mis-operation of the semiconductor chip 20. Here, the bump 50 is formed with a set height H by a photosensitive photoresist, and thus the solder cap 80 is separated from the semiconductor chip 20 by the set height H, to prevent mis-operation of the semiconductor chip 20 by alpha particles.

The sidewalls of the bump 50 formed by the photosensitive photoresist are not vertical but inclined at a predetermined angle. In order to form the bump 50 with the preset height H, it is necessary to obtain a sufficient area of bump 50 contacting the electrode pad 10 of the semiconductor chip 20. When the pitch between the electrode pads 10 of the semiconductor chip 20 and the pitch between the bumps 50 are reduced, shorts occur between the bumps 50.

In addition, when the solder cap 80 contacts the electrode terminal 60 of the PCB 70, the solder cap 80 is pressed flat. Accordingly, if the pitch between the electrode pads 10 of the semiconductor chip 20 and the pitch between the bumps 50 are reduced, shorts occur between the bumps 50.

As a result, the conventional semiconductor package is disadvantageous in a slim and lightweight shape with multi-pin of the semiconductor chip 20.

SUMMARY OF THE INVENTION

Therefore, an object of the present invention is to provide a bump for a semiconductor package which can electrically connect electrode terminals of a PCB to electrode pads of a semiconductor chip with high reliability and excellent electrical properties, a semiconductor package applying the bump, and a method for fabricating the semiconductor package.

To achieve these and other advantages and in accordance with the purpose of the present invention, as embodied and broadly described herein, there is provided a bump for a semiconductor package, including: a metal adhering layer formed on the surface of a semiconductor chip; a first bump unit formed on the metal adhering layer; and a second bump unit formed on the first bump unit, a width of the second bump unit being smaller than that of the first bump unit.

According to one aspect of the present invention, a semiconductor package includes: a semiconductor chip on which an electrode pad has been formed; a protecting film formed on the surface of the semiconductor chip, for selectively exposing the electrode pad; a metal adhering layer formed on the electrode pad, and extended from the upper portion of the electrode pad to the upper portion of the protecting film around the electrode pad; a first bump unit formed on the metal adhering layer; a second bump unit formed on the first bump unit, a width of the second bump unit being smaller than that of the first bump unit; and a PCB on which an electrode terminal contacting the top surface of the second bump unit has been formed.

According to another aspect of the present invention, a method for fabricating a semiconductor package includes the steps of: forming a metal adhering layer on a semiconductor chip on which at least one electrode pad selectively exposed by a protecting film has been formed; forming a first photosensitive photoresist on the metal adhering layer, and performing whole light exposure thereon; forming a second photosensitive photoresist on the whole light exposed first photosensitive photoresist, and performing local light exposure thereon; developing the second photosensitive photoresist and the first photosensitive photoresist; forming a bump on the metal adhering layer exposed by developing the second photosensitive photoresist and the first photosensitive photoresist, and removing the second photosensitive photoresist and the first photosensitive photoresist; etching the metal adhering layer exposed by removing the first photosensitive photoresist and the second photosensitive photoresist; and making the electrode terminal of the PCB contact the top surface of the bump.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A bump for a semiconductor package, a semiconductor package applying the bump, and a method for fabricating the semiconductor package in accordance with the preferred embodiments of the present invention will now be described in detail with reference to the accompanying drawings.

Figure 3:
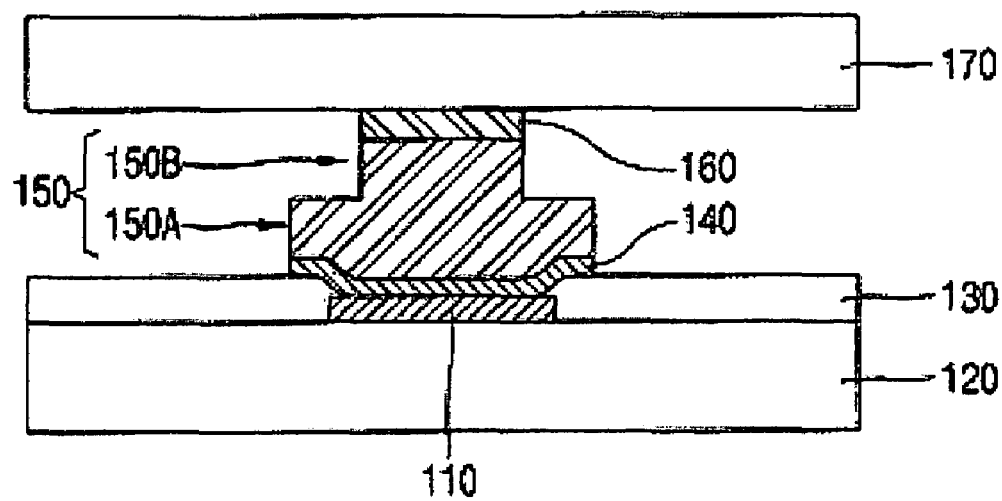
FIG. 3 is an exemplary diagram illustrating a semiconductor package using a metal bump in accordance with a preferred embodiment of the present invention.

FIG. 3 is an exemplary diagram illustrating a semiconductor package using a metal bump in accordance with the present invention.

As shown in FIG. 3, the semiconductor package includes a semiconductor chip 120 on which an electrode pad 110 has been formed, a protecting film 130 formed on the surface of the semiconductor chip 120, for selectively exposing the electrode pad 110, a metal adhering layer 140 formed on the electrode pad 110, and extended from the upper portion of the electrode pad 110 to the upper portion of the protecting film 130 around the electrode pad 110, a first bump unit 150A formed on the metal adhering layer 140, a second bump unit 150B formed on the first bump unit 150A with a smaller width than the first bump unit 150A, and a PCB 170 on which an electrode terminal 160 contacting the top surface of the second bump unit 150B has been formed.

The second bump unit 150B is thermocompression bonded and hardened to the electrode terminal 160 of the PCB 170 by the medium of a polymer containing anisotropic conductive particles, thereby electrically connecting the electrode pad 110 of the semiconductor chip 120 to the electrode terminal 160 of the PCB 170. Therefore, as compared with the general semiconductor package fabricated by wire bonding, a transmission distance of electric signals is reduced to obtain a high speed, and a size of the semiconductor package is reduced, which is advantageous in a slim and lightweight shape.

The polymer containing anisotropic conductive particles can be prepared by using a thermosetting resin or a thermosetting and thermoplastic resin. Here, the thermosetting resin or the thermosetting and thermoplastic resin includes spherical or angular conductive metal balls being composed of one of Au, Ni, Ag and Cu and having a grain size of 0.5 to 10 mm.

Exemplary polymers containing anisotropic conductive particles include a liquid phase anisotropic conductive adhesive and a solid phase anisotropic conductive film quasi-hardened in a predetermined shape.

On the other hand, the second bump unit 150B has a smaller width than the first bump unit 150A, to minimize a pitch between the electrode pads 110 of the semiconductor chip 120 and a pitch between the bumps 150A and 150B. Accordingly, the semiconductor chip 120 is advantageous in a slim and lightweight shape with multi-pin.

That is, a semiconductor process can be applied to the semiconductor chip 120. It is thus possible to minimize the pitch between the electrode pads 110 and the pitch between the first and second bump units 150A and 150B. Conversely, the semiconductor process cannot be applied to the PCB 170. It is this difficult to reduce a size of lines and electrode terminals 160. In accordance with the present invention, contact failure is restricted even when the pitch between the electrode pads 110 of the semiconductor chip 120 does not correspond to the pitch between the electrode terminals 160 of the PCB 170, by reducing the width of the second bump unit 150B connected to the electrode terminal 160 of the PCB 170. In addition, the second bump unit 150B is prevented from contacting lines adjacent to the electrode terminal 160 of the PCB 170.

Figure 1:
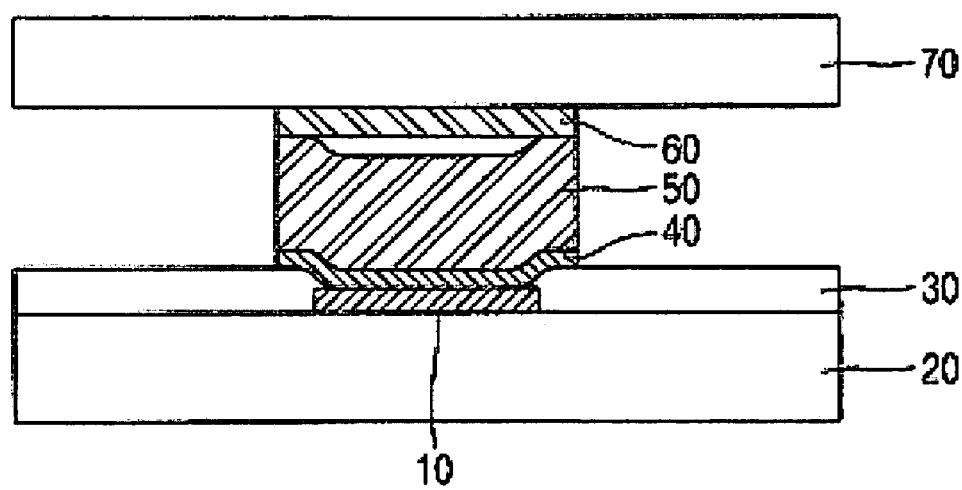
FIG. 1 is an exemplary diagram illustrating a conventional semiconductor package using a metal bump.

In the conventional art, as explained above with reference to FIG. 1, the metal bump 50 having its top center more caved than its edges is thermocompression bonded and hardened to the electrode terminal 60 of the PCB 70 by the medium of the polymer containing anisotropic conductive particles, which increases an electric contact resistance between the metal bump 50 and the electrode terminal 60 of the PCB 70, and deteriorates an adhesion property thereof.

However, in accordance with the present invention, still referring to FIG. 3, the second bump unit 150B connected to the electrode terminal 160 of the PCB 170 has a smaller width than the first bump unit 150B, so that the top surface of the second bump unit 150B can be formed flat. The second bump unit 150B having the flat surface is thermocompression bonded and hardened to the electrode terminal 160 of the PCB 170 by the medium of the polymer containing anisotropic conductive particles, thereby minimizing the electric contact resistance between the second bump unit 150B and the electrode terminal 160 of the PCB 170, and preventing deterioration of the adhesion property thereof. Here, the width of the second bump unit 150B is smaller than that of the first bump unit 150A by 10 to 150 mm.

Figure 4A:
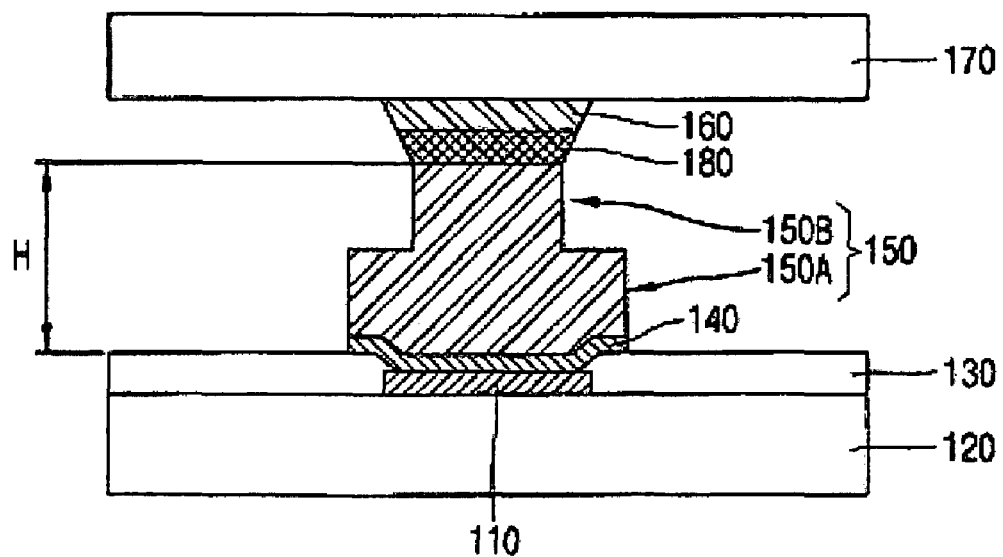
FIGS. 4A and 4B are exemplary diagrams illustrating a second bump unit and an electrode terminal of a PCB coupled through a solder cap formed on the top surface of the second bump unit in FIG. 3.

FIG. 4A is an exemplary diagram illustrating the second bump unit 150B and the electrode terminal 160 of the PCB 170 coupled through a solder cap formed on the top surface of the second bump unit 150B in FIG. 3.

As depicted in FIG. 4A, the second bump unit 150B contacts the electrode terminal 160 of the PCB 170 through the solder cap 180 formed on its top surface.

The solder cap 180 is composed of one of Pb/Sn, Sn/(5%)Pb and Sn/(2.5)Ag, or an alloy prepared by adding at least one of Zn, In, Cu, Ag, Au, Bi and P to Sn or Pb.

As described above, the solder cap 180 generates alpha particles by radiation during the process for fabricating the semiconductor package, thereby causing mis-operation of the semiconductor chip 120. Therefore, the mis-operation of the semiconductor chip 120 by alpha particles of the solder cap 80 must be prevented by separating the solder cap 180 from the semiconductor chip 120 by a set height H.

Figure 2:
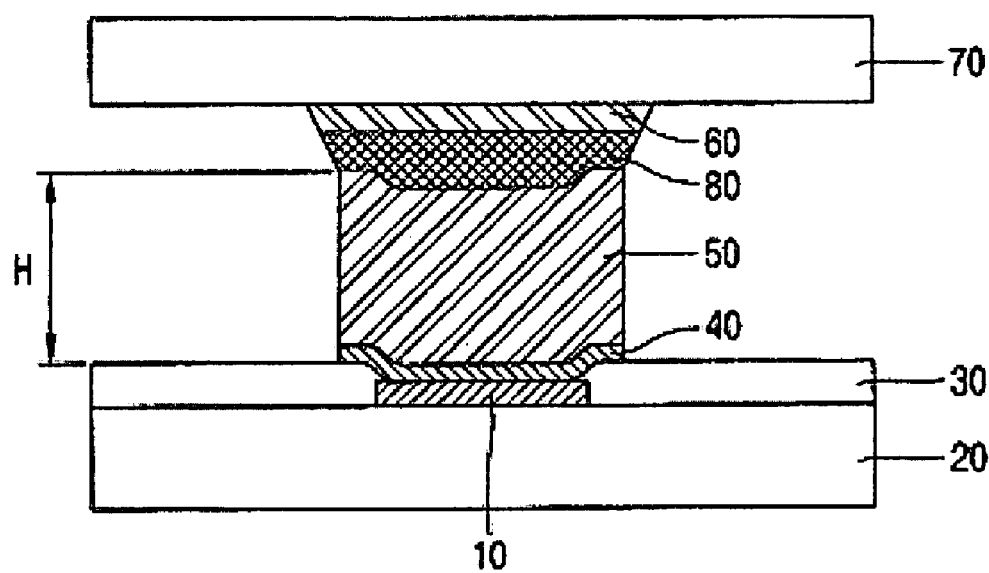
FIG. 2 is an exemplary diagram illustrating a bump and an electrode terminal of a PCB coupled through a solder cap formed on the top surface of the bump in FIG. 1.

In the conventional art, as explained above with reference to FIG. 2, in the case that the bump 50 is formed with the set height H by a photosensitive photoresist, the sidewalls of the bump 50 are inclined at a predetermined angle. It is thus necessary to obtain a sufficient area of bump 50 contacting the electrode pad 10 of the semiconductor chip 20. When the pitch between the electrode pads 10 of the semiconductor chip 20 and the pitch between the bumps 50 are reduced, shorts occur between the bumps 50. In addition, when the solder cap 80 contacts the electrode terminal 60 of the PCB 70, the solder cap 80 is pressed flat. Accordingly, if the pitch between the electrode pads 10 of the semiconductor chip 20 and the pitch between the bumps 50 are reduced, shorts occur between the bumps 50. The semiconductor chip 20 is disadvantageous in a slim and lightweight shape with multi-pin.

However, in accordance with the present invention, as illustrated in FIG. 4A, the first bump unit 150A contacting the electrode pad 110 of the semiconductor chip 120 is formed through the metal adhering layer 140, and the second bump unit 150B contacting the electrode terminal 160 of the PCB 170 is formed on the first bump unit 150A with a smaller width than the first bump unit 150A, to compose the bump 150A and 150B. As a result, the bump 150A and 150B can be formed with the set height H, without increasing the area of the first bump unit 150A. When the solder cap 180 formed on the second bump unit 150B contacts the electrode terminal 160 of the PCB 170, even if the solder cap 180 is pressed flat, shorts do not occur between the adjacent bumps. If necessary, the first bump unit 150A and the second bump unit 150B can be formed to have the same height H/2 or different height.

Thus, the semiconductor package is advantageous in a slim and lightweight shape with multi-pin of the semiconductor chip 120.

The bump 150A and 150B is composed of Au, Sn/37Pb, Sn/95Pb, Cu, Sn/Ag or Ni. Electric electrolytic plating, Au-stud, electroless plating or stencil printing can be applied to form the bump 150A and 150B.

Figure 4B:
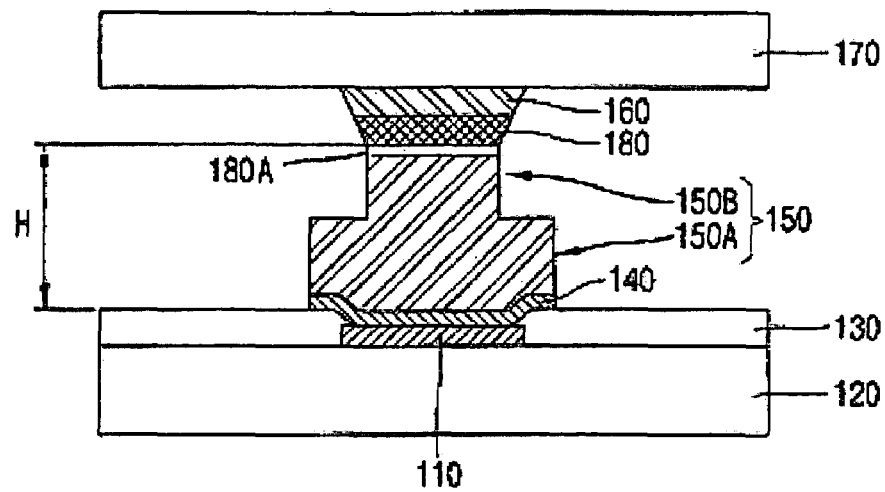

On the other hand, a diffusion barrier film (180A, FIG. 4B) can be further formed on the surface of the final copper bump 150 to prevent diffusion between the copper bump 150 and solder cap 180 (and/or between the electrode terminal 160 of the PCB 170 and the solder cap 180) to improve an adhesion property thereof. Here, the diffusion barrier film is composed of one of Ni, V and P, or an alloy containing at least one of Ni, V and P.

FIGS. 5a to 5h are exemplary diagrams illustrating sequential steps of a method for fabricating a semiconductor package in accordance with the present invention. The method for fabricating the semiconductor package will now be described in detail with reference to FIGS. 5a to 5h.

Figure 5A:
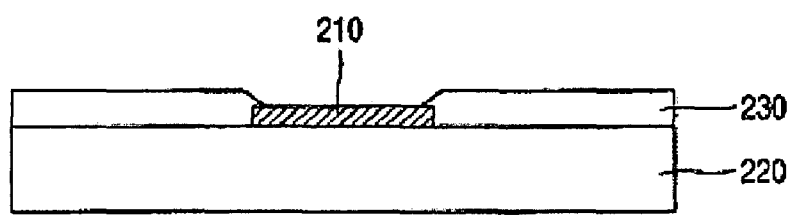
FIGS. 5a to 5h are exemplary diagrams illustrating sequential steps of a method for fabricating a semiconductor package in accordance with a preferred embodiment of the present invention.

As shown in FIG. 5a, a protecting film 230 is formed on the top surface of a semiconductor chip 220 on which an electrode pad 210 has been formed, and selectively etched to expose the electrode pad 210.

Figure 5B:
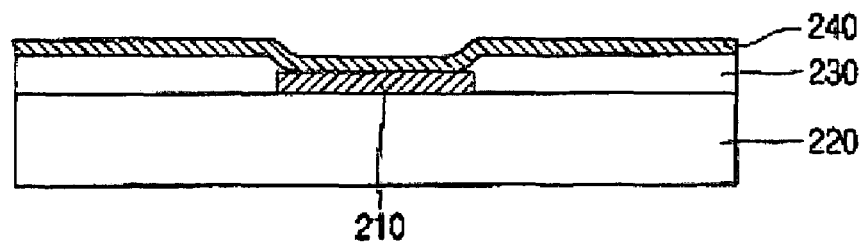

As depicted in FIG. 5b, a metal adhering layer 240 is formed on the protecting film 230 on which the electrode pad 210 has been exposed. Here, the metal adhering layer 240 is formed at a thickness of 100 to 20000 Å according to sputtering, thermal deposition or electron beam deposition.

The electrode pad 210 can be composed of a metal such as Ti, Al, Cr or Cu, or an alloy containing at least one of Ti, Al, Cr and Cu.

In addition, the metal adhering layer 240 can be composed of a metal containing at least one of TiW, Ti, Cr, Ni, V, Bi, Cu and Au having an excellent wetting property to the electrode pad 210 of the semiconductor chip 220. For example, the metal adhering layer 240 consists of a base layer composed of TiW, Ti or Cr, a diffusion barrier layer composed of Ni, and an anti-oxidation layer composed of Au.

Figure 5C:
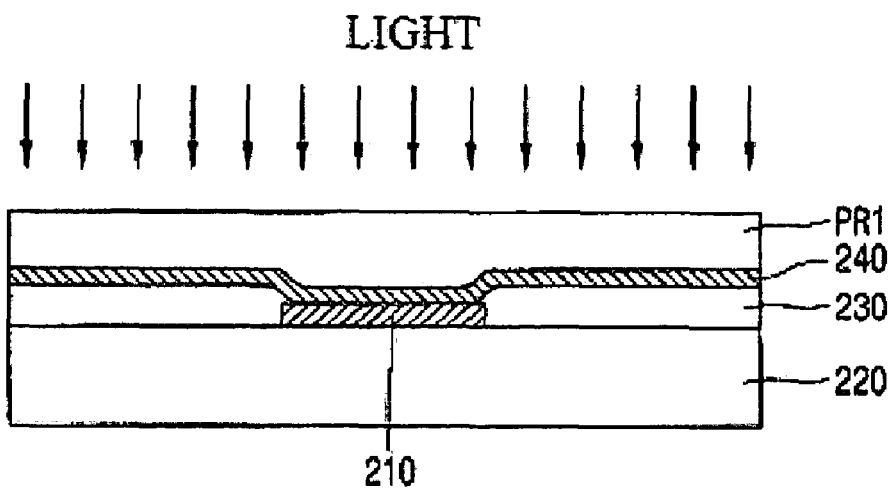

As illustrated in FIG. 5c, a first photosensitive photoresist PR1 is formed on the metal adhering layer 240, and whole light exposure is performed thereon. Here, the first photosensitive photoresist PR1 is a positive type.

Figure 5D:
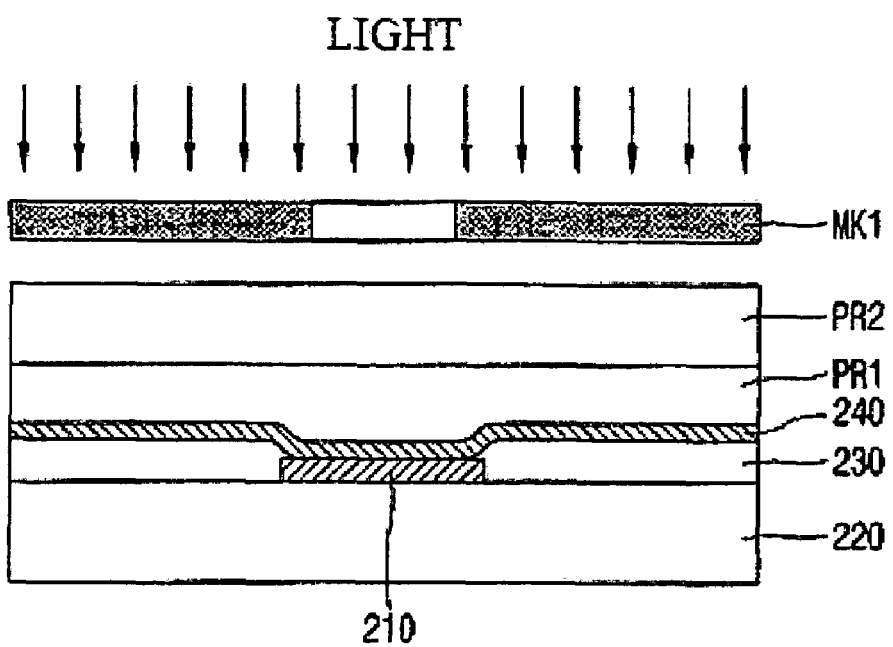

Referring to FIG. 5d, a second photosensitive photoresist PR2 is formed on the first photosensitive photoresist PR1, and local light exposure is performed thereon by using a mask MK1 for selectively transmitting and intercepting light. Here, the second photosensitive photoresist PR2 is a positive type. Patterns for transmitting light to the region of the semiconductor chip 220 on which the electrode pad 210 has been formed can be formed on the mask MK1.

Figure 5E:
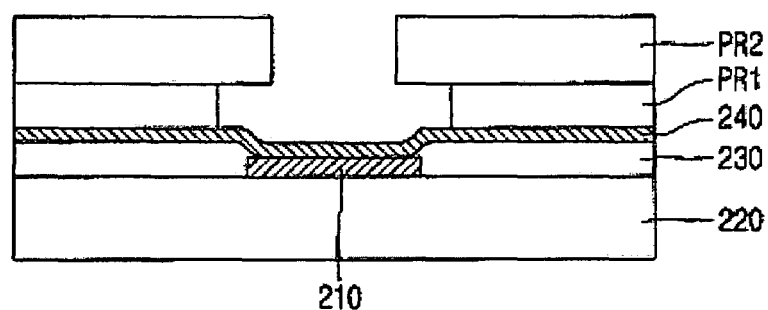

As shown in FIG. 5e, the second photosensitive photoresist PR2 and the first photosensitive photoresist PR1 are developed to expose the metal adhering layer 240. Here, the whole light exposed first photosensitive photoresist PR1 is developed wider than the local light exposed second photosensitive photoresist PR2.

Figure 5F:
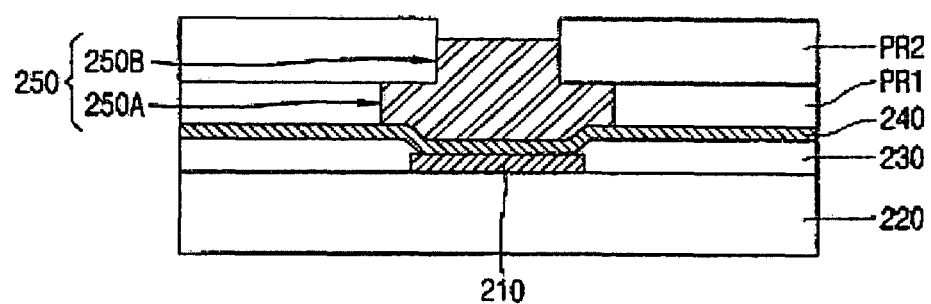

As illustrated in FIG. 5f, a bump 250 consisting of a first bump unit 250A and a second bump unit 250B is formed according to electric electrolytic plating or electroless plating on the metal adhering layer 240 exposed by developing the first photosensitive photoresist PR1 and the second photosensitive photoresist PR2. Here, the bump 250 formed according to electric electrolytic plating or electroless plating fills the developed regions of the first photosensitive photoresist PR1 and the second photosensitive photoresist PR2. Accordingly, the first bump unit 250A filling the developed region of the first photosensitive photoresist PR1 has a larger width than the second bump unit 250B filling the developed region of the second photosensitive photoresist PR2.

On the other hand, in the case that the solder cap (180) is formed on the top surface of the second bump unit (150B) as shown in FIG. 4A, the solder cap is formed after the bump 250.

Figure 5G:
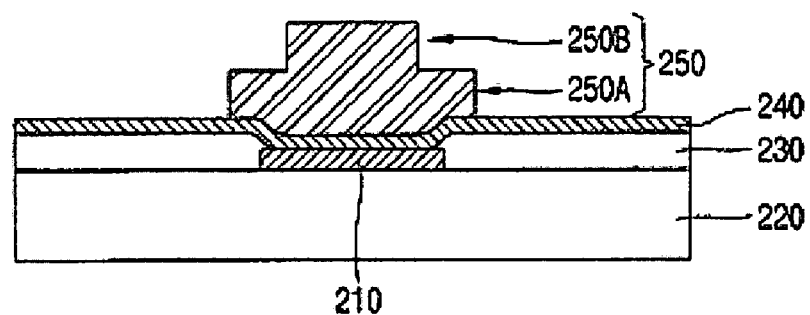

Referring to FIG. 5g, the second photosensitive photoresist PR2 and the first photosensitive photoresist PR1 are removed.

Figure 5H:
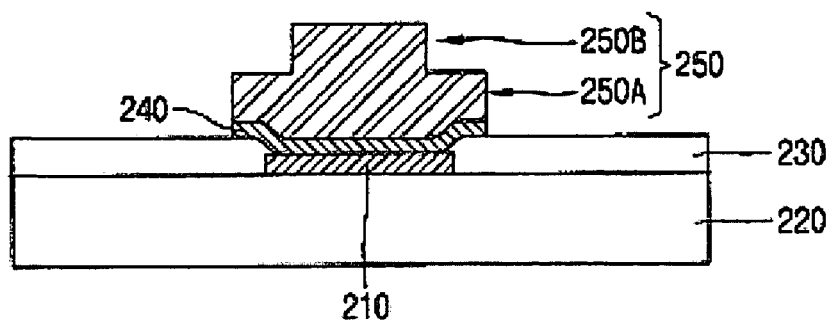

As shown in FIG. 5h, the metal adhering layer 240 is etched by using the bump 250 as a mask. Here, the metal adhering layer 240 is etched according to wet etching using chemicals or dry etching using a physical method.

Thereafter, a polymer containing anisotropic conductive particles is disposed between the second bump unit 250B and an electrode terminal of a PCB, and thermocompression bonded and hardened, so that the electrode terminal of the PCB can contact the top surface of the second bump unit 250B.

In the case that the solder cap is formed on the top surface of the second bump unit 250B, the solder cap and the electrode terminal of the PCB are compressed and bonded at a temperature ranging from 100 to 400° C.

In this embodiment, it has been described that the bump 250 is formed according to electric electrolytic plating or electroless plating. However, the bump 250 can also be formed according to Au-stud or stencil printing. The present invention may be embodied in several forms by those skilled in this field without departing from the major technical ideas thereof, such as the structure of the bump 250 in which the second bump unit 250B has a smaller width than the first bump unit 250A.

As discussed earlier, in accordance with the present invention, the second bump unit contacting the electrode terminal of the PCB has a smaller width than the first bump unit contacting the electrode pad of the semiconductor chip through the metal adhering layer.

Even though the pitch between the electrode pads of the semiconductor chip does not correspond to the pitch between the electrode terminals of the PCB, contact reliability can be improved by the bump. In addition, the bump does not contact the lines adjacent to the electrode terminal of the PCB, thereby preventing the mis-operation of the semiconductor package. Accordingly, the pitch between the electrode pads of the semiconductor chip and the pitch between the bumps are minimized, and thus the semiconductor chip is advantageous in a slim and lightweight shape with multi-pin.

Furthermore, the top surface of the second bump unit contacting the electrode terminal of the PCB is formed flat to minimize the electric contact resistance between the second bump unit and the electrode terminal of the PCB and prevent deterioration of the adhesion property thereof.

In the case that the solder cap is formed on the top surface of the second bump unit to contact the electrode terminal of the PCB, the bump can be formed with the preset height without increasing the area of the first bump unit. Therefore, shorts do not occur between the adjacent bumps. When the solder cap formed on the second bump unit contacts the electrode terminal of the PCB, even if the solder cap is pressed flat, shorts do not occur between the adjacent bumps. As a result, the semiconductor chip is advantageous in a slim and lightweight shape with multi-pin.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A bump for a semiconductor package, comprising:
   a metal adhering layer formed on the surface of a semiconductor chip;
   a first bump unit formed on the metal adhering layer; and
   a second bump unit formed on the first bump unit, a width of the second bump unit being smaller than that of the first bump unit, wherein the width of the second bump unit is smaller than that of the first bump unit by 10 to 150 mm.

2. The bump of claim 1, wherein an electrode pad of the semiconductor chip is selectively exposed by a protecting film. and the metal adhering layer is formed on the electrode pad of the semiconductor chip and extended from the upper portion of the electrode pad to the upper portion of the protecting film around the electrode pad.

3. The bump of claim 1, wherein the first and second bump units are composed of at least one selected from the group consisting of Au, Sn/37Pb, Sn/95Pb, Cu, Sn/Ag and Ni.

4. The bump of claim 1, wherein the first and second bump units are formed with the same height or different height.

5. The bump of claim 2, wherein the electrode pad of the semiconductor chip is composed of at least one selected from the group consisting of Ti, Al, Cr and Cu, or an alloy containing at least one selected from the group consisting of Ti, Al, Cr and Cu.

6. The bump of claim 1, wherein the metal adhering layer is composed of a metal containing at least one selected from the group consisting of TiW, Ti, Cr, Ni, V. Bi, Cu and Au having an excellent wetting property to the electrode pad of the semiconductor chip.

7. The bump of claim 1, wherein the metal adhering layer is formed at a thickness of 100 to 20000Å.

8. The bump of claim 1, further comprising a solder cap formed on the top surface of the second bump unit.

9. The bump of claim 8, wherein the solder cap is composed of at least one selected from the group consisting of Pb/Sn, Sn/(5%)Pb and SnI(2.5)Ag, or an alloy prepared by adding at least one selected from the group consisting of Ag, Au, Bi, Cu, In, Zn, and P to Sn or Pb.

10. The bump of claim 8, further comprising a diffusion barrier film formed on the surface of the copper bump and composed of at least one selected from the group consisting of Ni, V and P, or an alloy containing at least one selected from the group consisting of Ni, V and P.

11. A semiconductor package, comprising:
a semiconductor chip on which an electrode pad has been formed;
a protecting film formed on the surface of the semiconductor chip, for selectively exposing the electrode pad;
a metal adhering layer formed on the electrode pad, and extended from the upper portion of the electrode pad to the upper portion of the protecting film around the electrode pad;
a first bump unit formed on the metal adhering layer;
a second bump unit formed on the first bump unit, a width of the second bump unit being smaller than that of the first bump unit; and
a PCB on which an electrode terminal contacting the top surface of the second bump unit has been formed,
wherein the top surface of the second bump unit and the electrode terminal of the PCB are thermocompression bonded and hardened to contact each other by the medium of a polymer containing anisotropic conductive particles.

12. The semiconductor package of claim 11, wherein the polymer containing anisotropic conductive particles is a liquid phase anisotropic conductive adhesive or a solid phase anisotropic conductive film quasi-hardened in a predetermined shape.

13. The semiconductor package of claim 11, wherein the polymer containing anisotropic conductive particles comprises a thermosetting resin or a thermosetting and thermoplastic resin as a major element, and also comprises spherical or angular conductive metal balls.

14. The semiconductor package of claim 13, wherein the conductive metal balls are composed of at least one selected from the group consisting of Au, Ni, Ag and Cu.

15. The semiconductor package of claim 13, wherein the conductive metal balls have a grain size of 0.5 to 10 mm.

16. The semiconductor package of claim 11, wherein the top surface of the second bump unit and the electrode terminal of the PCB contact each other through a solder cap formed on the top surface of the second bump unit.

17. A method for fabricating a semiconductor package, comprising the steps of:
forming a metal adhering layer on a semiconductor chip on which at least one electrode pad selectively exposed by a protecting film has been formed;
forming a first photosensitive photoresist on the metal adhering layer, and performing whole light exposure thereon;
forming a second photosensitive photoresist on the whole light exposed first photosensitive photoresist, and performing local light exposure thereon;
developing the second photosensitive photoresist and the first photosensitive photoresist;
forming a bump consisting of first and second bump units on the metal adhering layer exposed by developing the second photosensitive photoresist and the first photosensitive photoresist;
removing the second photosensitive photoresist and the first photosensitive photoresist;
etching the metal adhering layer exposed by removing the first photosensitive photoresist and the second photosensitive photoresist; and
making the electrode terminal of the PCB contact the top surface of the second bump unit.

18. The method of claim 17, wherein the bump consisting of the first bump unit and the second bump unit is formed according to electric electrolytic plating or electroless plating.

19. The method of claim 17, wherein the metal adhering layer is formed at a thickness of 100 to 20000Å according to sputtering, thermal deposition or electron beam deposition.

20. The method of claim 17, wherein the step for etching the metal adhering layer is performed according to wet etching using chemicals or dry etching using a physical method.

21. The method of claim 17, wherein the step for making the electrode terminal of the PCB contact the top surface of the second hump unit disposes a polymer containing anisotropic conductive particles between the second hump unit and the electrode terminal of the PCB, and performs thermocompression bonding and hardening thereon.

22. The method of claim 17, further comprising a step for forming a solder cap on the top surface of the second bump unit after forming the bump consisting of the first and second bump units.

23. The method of claim 22, wherein the solder cap formed on the top surface of the second bump unit and the electrode terminal of the PCB are compressed and bonded at a temperature ranging from 100 to 400° C.

24. The method of claim 22, further comprising a step for forming a diffusion barrier layer on the surface of copper bump consisting of the first and second bump units.

* * * * *

UNITED STATES PATENT AND TRADEMARK OFFICE
CERTIFICATE OF CORRECTION

PATENT NO. : 7,170,170 B2　　　　　　　　　　　　　　　　　Page 1 of 1
APPLICATION NO. : 10/976427
DATED : January 30, 2007
INVENTOR(S) : Yong-Woon Yeo It is certified that error appears in the above-identified patent and that said Letters Patent is hereby corrected as shown below:

At Col. 9, line 20, please replace "Snl(2.5)Ag" with -- Sn/(2.5)Ag --.
At Col. 10, line 45, please replace "hump" with --bump--.
At Col. 10, line 46, please replace "hump" with --bump--.

Signed and Sealed this

Twentieth Day of November, 2007

JON W. DUDAS
*Director of the United States Patent and Trademark Office*